United States Patent
Ben-Efraim et al.

[11] Patent Number: 6,134,282
[45] Date of Patent: Oct. 17, 2000

[54] METHOD FOR LOWPASS FILTER CALIBRATION IN A SATELLITE RECEIVER

[75] Inventors: Nadav Ben-Efraim, Cupertino; Christopher Keate, Santa Clara, both of Calif.

[73] Assignee: LSI Logic Corporation, Milpitas, Calif.

[21] Appl. No.: 08/878,329

[22] Filed: Jun. 18, 1997

[51] Int. Cl.[7] .................................................. H04B 1/10
[52] U.S. Cl. ........................................... 375/350; 455/266
[58] Field of Search ..................................... 375/316, 343, 375/344, 350; 455/266, 340, 3.2

[56] References Cited

U.S. PATENT DOCUMENTS 5,511,235  4/1996  Duong et al. ............................. 455/75
5,933,769  8/1999  Kaneko .................................... 455/296

Primary Examiner—Don N. Vo
Assistant Examiner—Phuong Phu
Attorney, Agent, or Firm—Conley Rose & Tayon; B. Noel Kivlin

[57] ABSTRACT

An improved satellite receiver front end architecture having a tuner chip and a demodulator/decoder chip. The tuner chip includes a lowpass filter having a configurable cutoff frequency, and the tuner chip uses a frequency signal to provide accurate adjustment of the cutoff frequency. A clock signal having a clock frequency is converted into a control voltage which determines the cutoff frequency of the lowpass filter. Consequently, the cutoff frequency may be increased by increasing the clock frequency, or decreased by decreasing the clock frequency. This configuration provides for improved cutoff frequency control in the presence of signal interference.

12 Claims, 6 Drawing Sheets

METHOD FOR LOWPASS FILTER CALIBRATION IN A SATELLITE RECEIVER

BACKGROUND OF THE INVENTION

1. Field of the Invention

This invention relates to an apparatus for receiving and decoding a digital signal. More specifically, it concerns a front end for a set top satellite receiver system.

2. Description of the Related Art

Digital broadcast satellite (DBS) communication systems provide reliable long range transmission of information without the need for a pre-existing network of transmission lines and routing switches. However, since the costs entailed in creating a satellite and placing it in orbit are literally astronomical, the economic practicality of these systems depends in large part on widespread use of DBS receiver systems. Consequently containment of the costs while maximizing the performance of DBS receiver systems plays an important role for the emerging DBS technology.

FIG. 1 shows a diagram of portions of a DBS system 100 in operation. A service provider 102 broadcasts a signal by way of a satellite 104 to a user dish 106. In this manner, user dish 106 receives an encoded digital data stream modulated onto a carrier in the Ku-Band (12 GHz). User dish 106 has a down-converter (also referred to as a low-noise block, or LNB) which provides a receive signal 108 to DBS receiver 110. Receive signal 108 is obtained by shifting the frequency of the modulated signal carrier from Ku-Band to the L-Band (1–2 GHz). DBS receiver 110 comprises a front end that demodulates and decodes the digital data stream, and a back end that processes the digital data stream to implement the provided services, e.g. digital cable programming. DBS receiver 110 is colloquially referred to as a set-top box since it is commonly positioned on top of a television set 112 as shown.

In DBS system 100, the digital signal modulation is typically of the binary or quadrature phase shift keying type. The signal passes through the atmosphere and is subjected to various forms of interference. Hence a first issue which must be addressed by the DBS receiver front end is that the received signal is a corrupted version of the transmitted signal. Due to the power restrictions placed on satellite transmission channels, the probability of digital data errors due to signal corruption is substantial. To maximize a signal power to noise power ratio (SNR) of the signal, equalization is used. However, to make satellite communications reliable at high data rates, error correction codes are needed. The error correction coding scheme advocated by the standard "Specifications of the Baseline Modulation/Channel Coding System for Digital Multi-Programme Television by Satellite", European Broadcasting Union, January 1994, is a concatenated coding scheme.

A second issue which must be addressed by the DBS receiver front end is frequency drift. For example, one source of frequency drift is that the carrier frequency of the output signal provided by an economical LNB can drift by ±5 MHz with temperature.

FIG. 2 shows one implementation of a DBS receiver front end 200. Front end 200 comprises a tuner 202 and a demodulator/decoder 204. Tuner 202 converts received signal 108 to quadrature baseband signals. Demodulator/decoder 204 converts the quadrature baseband signals to digital form, then performs digital equalization and decoding to produce output data stream 238. As discussed further below, demodulator/decoder 204 also provides feedback signals to tuner 202 for timing and gain control.

Tuner 202 comprises a frequency synthesizer 216 (typically comprising a voltage controlled oscillator), an analog multiplier 206, an intermediate frequency bandpass filter 208, a gain control amplifier 210, an I/Q down converter 212, and a lowpass filter 214. Frequency synthesizer 216 is set by an external microprocessor 236 to be "tuned" to the received signal. The tuned frequency synthesizer provides a signal with a frequency which is offset by a fixed amount (typically 480 MHz) from the frequency of the desired received signal. The fixed amount will be the frequency of a product signal which results when multiplier 206 multiplies the signal from the frequency synthesizer and the received signal.

Multiplier 206 multiplies received signal 108 and the output signal from frequency synthesizer 216 to effectively shift the frequency of received signal 108 to an intermediate frequency (typically 480 MHz) in an intermediate frequency signal. The product signal at the output of multiplier 206 can be expressed as the sum of a desired intermediate frequency signal and other undesired byproduct signals. The product signal is coupled to intermediate frequency bandpass filter 208 which removes the undesired frequency components (and in so doing, removes the undesired byproduct signals) leaving only the intermediate frequency signal.

Output from bandpass filter 208 is coupled to gain control amplifier 210 which regulates the amplitude of the intermediate frequency signal. Gain control amplifier 210 has an adaptive gain which is set to provide a constant-maximum amplitude output signal. The regulation mechanism is a loop filter 234 which operates on a negative feedback signal provided by demodulator/decoder 204. The effect of loop filter 234 is to increase the gain of gain control amplifier 210 when the maximum amplitude of the output signal declines below a target level, and to decrease the gain when the maximum amplitude exceeds a target level.

Output of the gain control amplifier 210 is coupled to I/Q down converter 212 which converts the intermediate frequency signal to quadrature baseband signals. The conversion may take place in a similar fashion to the previous frequency conversion using output from a fixed-frequency oscillator 218, but at baseband two signals are needed. The two baseband signals represent the in-phase (I) and quadrature-phase (Q) components of the intermediate frequency signal. A lowpass filter 214 is employed in the similar fashion to the way baseband filter was used to remove undesired frequency components. In this fashion, tuner 202 converts received signal 108 to quadrature baseband signals.

A third issue which is desirably addressed by the receiver front end is the number of parts required to construct a tuner. Typically, the tuner is constructed using a synthesizer element, an oscillator element, loop filter parts (often discrete components), low pass filter elements, an integrated circuit for the mixer, intermediate frequency bandpass filter, and I/Q downconverter, a metal enclosure (not shown) for RF (radio frequency) shielding, and voltage regulators (not shown) to provide very clean power. A reduction in the part count would advantageously reduce cost and improve reliability.

A fourth issue which must be addressed by the receiver front end is the sensitivity of the tuner to RF noise. Noise control is typically provided by the voltage regulators and metal enclosure. Other noise control features which provide further reduction in RF noise would advantageously improve tuner performance.

Returning to FIG. 2, tuner 202 is followed by demodulator/decoder 204. Demodulator/decoder 204 comprises an analog-to-digital converter (ADC) 220, a decimation block 222, a matched filter 224, a decode logic 226, and a timing, carrier and gain error block 230. ADC 220 converts the quadrature baseband signals into digital form at a sampling rate and sampling phase determined by a signal from a voltage controlled oscillator (VCO) 228. The digital baseband signals are decimated by decimation block 222 (i.e. the sample rate is reduced by dropping a fixed number of samples from each timing interval) to a rate of two samples per symbol interval. Decimation block 224 allows for over-sampling by ADC 220. Over-sampling is the practice of sampling an analog signal at a higher rate than the symbol rate. Use of this practice allows the transfer of some filtering operations from the analog domain to the digital domain. In general, only simple analog filters are practical. For complex filtering operations, digital filters are significantly easier to implement and adjust. By over-sampling and performing the matched filter operation in the digital domain, a substantial implementation complexity reduction is achieved. Furthermore, the use of over-sampling allows relaxed tolerances on the analog filters used in the analog-to-digital conversion process, without significant impairment to the signal-to-noise ratio.

The output of decimation block 222 passes through matched filter 224, which substantially maximizes the signal-to-noise ratio of the digital baseband signals. To accomplish this, the impulse response of matched filter 224 is designed to be the time-reverse of the shape of a signal corresponding to one symbol. Hence, the impulse response is "matched" to the symbol signal. One common symbol signal shape is a square root raised cosine.

The signal provided at the output of matched filter 224 is processed by decode logic 226 to provide error correction and substantially recover the transmitted data stream. This received data stream is then provided as output signal 238. In this manner, demodulator/decoder 204 converts the quadrature baseband signals to digital form, then performs digital equalization and decoding to produce output data stream 238.

The signal provided at the output of matched filter 224 is processed by timing, carrier and gain error block 230 to determine an estimate of error conditions present in the signal. One estimate is for the gain error, and this estimate is passed to loop filter 234, which was described above. A second estimate is for the sampling phase error, and this estimate is passed to loop filter 232. Loop filter 232 operates to regulate the sampling phase and frequency of ADC 220. A third estimate is formed for the carrier frequency offset error. This estimate is periodically sampled by external microprocessor 236 and used to adjust the setting of frequency synthesizer 216. In this manner, demodulator/ decoder 204 provides feedback signals to tuner 202 for timing and gain control.

FIG. 3 shows a second implementation of a DBS receiver front end 300. Components which have direct counterparts in front end 200 are numbered identically. Fixed-frequency oscillator 218 has been replaced with an intermediate frequency (IF) VCO 318. IF VCO 318 provides a signal to I/Q down converter 212 which a variable frequency which is regulated by loop filter 319 operating on a feedback signal provided by timing and gain error block 330. This approach allows for continuous monitoring and compensation of a limited amount of frequency drift. Large drifts must still be compensated by intervention of microprocessor 236. This is true because of the effect bandpass filter 208 has on signals which drift out of the range of the pass band.

The two discussed implementations of a DBS receiver front end are previously implemented methods for converting a DBS signal into a received data stream. Improved implementations are desirable. In particular, an implementation which does not require external microprocessor intervention for tracking frequency drift would both reduce cost and improve performance. Also, an implementation of the tuner which converts directly from the received signal to the baseband representation would be more cost effective. To make it feasible to do a direct conversion for DBS, however, a new method for correcting I/Q angular error is needed, and a new method for tracking frequency drift is needed. Tighter control must be provided for the lowpass filter since IF filtering is not an option in direct conversion system. Further, any technique which improves the system performance with little or no added cost is desirable.

SUMMARY OF THE INVENTION

The problems outlined above are in large part solved by an improved DBS receiver front end architecture having a tuner chip and a demodulator/decoder chip. The tuner chip includes a lowpass filter having a configurable cutoff frequency, and the tuner chip uses a frequency signal to advantageously provide accurate adjustment of the cutoff frequency. A clock signal having a clock frequency is converted into a control voltage which determines the cutoff frequency of the lowpass filter. Consequently, the cutoff frequency may be increased by increasing the clock frequency, or decreased by decreasing the clock frequency. This configuration provides for improved cutoff frequency control in the presence of signal interference.

Broadly speaking, the present invention contemplates a DBS receiver front end which includes a tuner chip and a demodulator/decoder chip. The tuner chip has a lowpass filter with a configurable cutoff frequency which is adjusted according to a clock signal frequency. The tuner chip receives a receive signal, converts it to a product signal, and filters the product signal with the lowpass filter. The demodulator/decoder chip provides the clock signal frequency to the tuner chip to indicate a desired reception bandwidth. The demodulator/decoder chip also converts the baseband signal to a decoded signal.

Features which the front end architecture may have include: (1) the front end being implemented as a tuner chip and a demodulator/decoder chip with a very small number of supporting discrete components, thereby reducing implementation cost and complexity, (2) the tuner chip using direct conversion, thereby reducing power consumption, (3) the tuning frequency synthesizer being split into a counter sub-circuit on the demodulator/decoder chip and a phase detection and oscillator sub-circuit on the tuner chip, thereby reducing the part count while minimizing interference with the tuner, (4) the phase detector having an externally configurable charge pump gain, thereby achieving a constant phase-lock loop behavior, (5) the oscillator sub-circuit employing a frequency doubler, thereby providing an extended frequency synthesis range while keeping complexity low, (6) the tuner having a precision-configurable lowpass filter, thereby providing accurate adjacent channel removal, (7) the interface signals between the tuner and demodulator/ decoder being provided at reduced amplitude and/or slew rate to minimize digital noise interference with the tuner, (8) the demodulator/ decoder providing equalization for I/Q amplitude and phase error, thereby providing an improved directconversion system performance, (9) the demodulator/decoder directly correcting for frequency offset error, thereby obviating the need for a bus from an external microprocessor to the tuner, and (10) the tuner chip pin out being designed to provide a maximal spacing between the pins for the received signal and pins for other high frequency signals.

BRIEF DESCRIPTION OF THE DRAWINGS

Other objects and advantages of the invention will become apparent upon reading the following detailed description and upon reference to the accompanying drawings in which.

Figure 1:
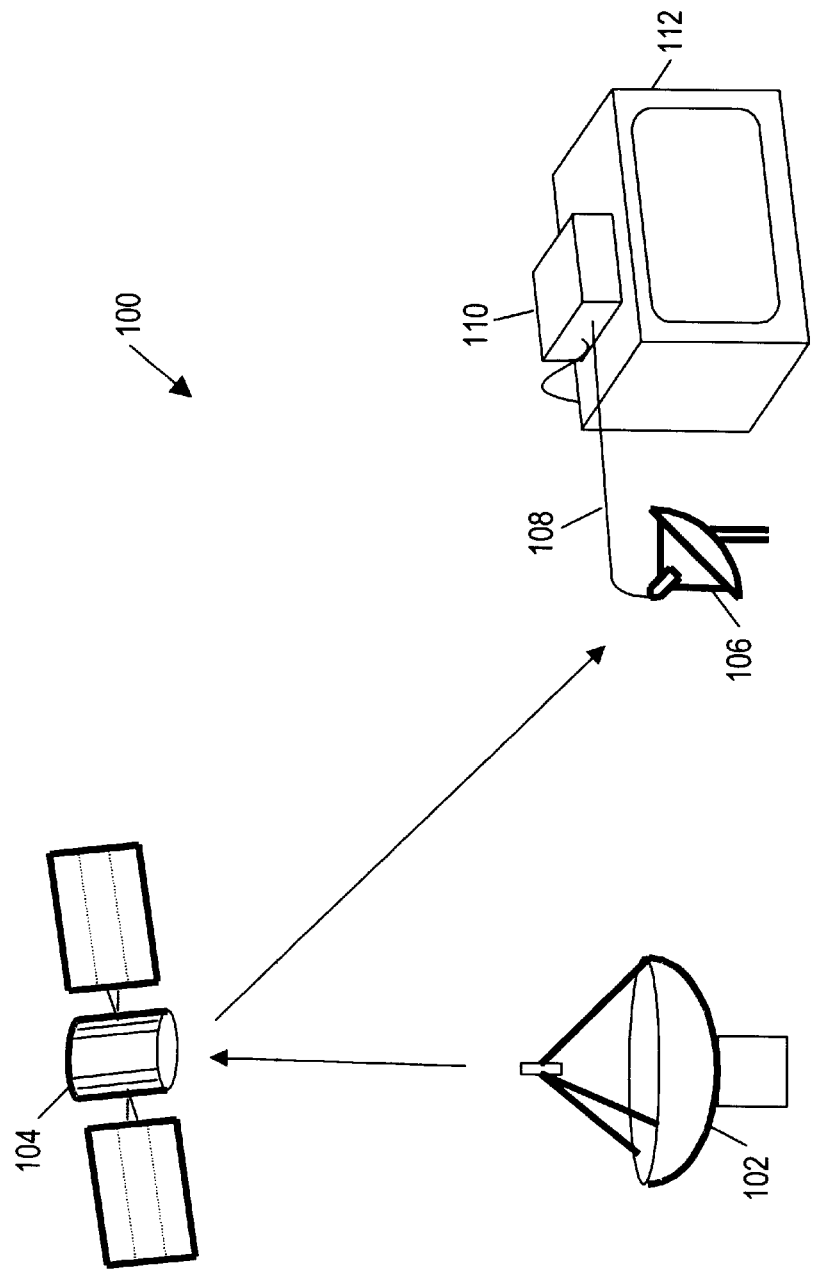
FIG. 1 is a high level view of a DBS system having a DBS receiver.
Figure 2:
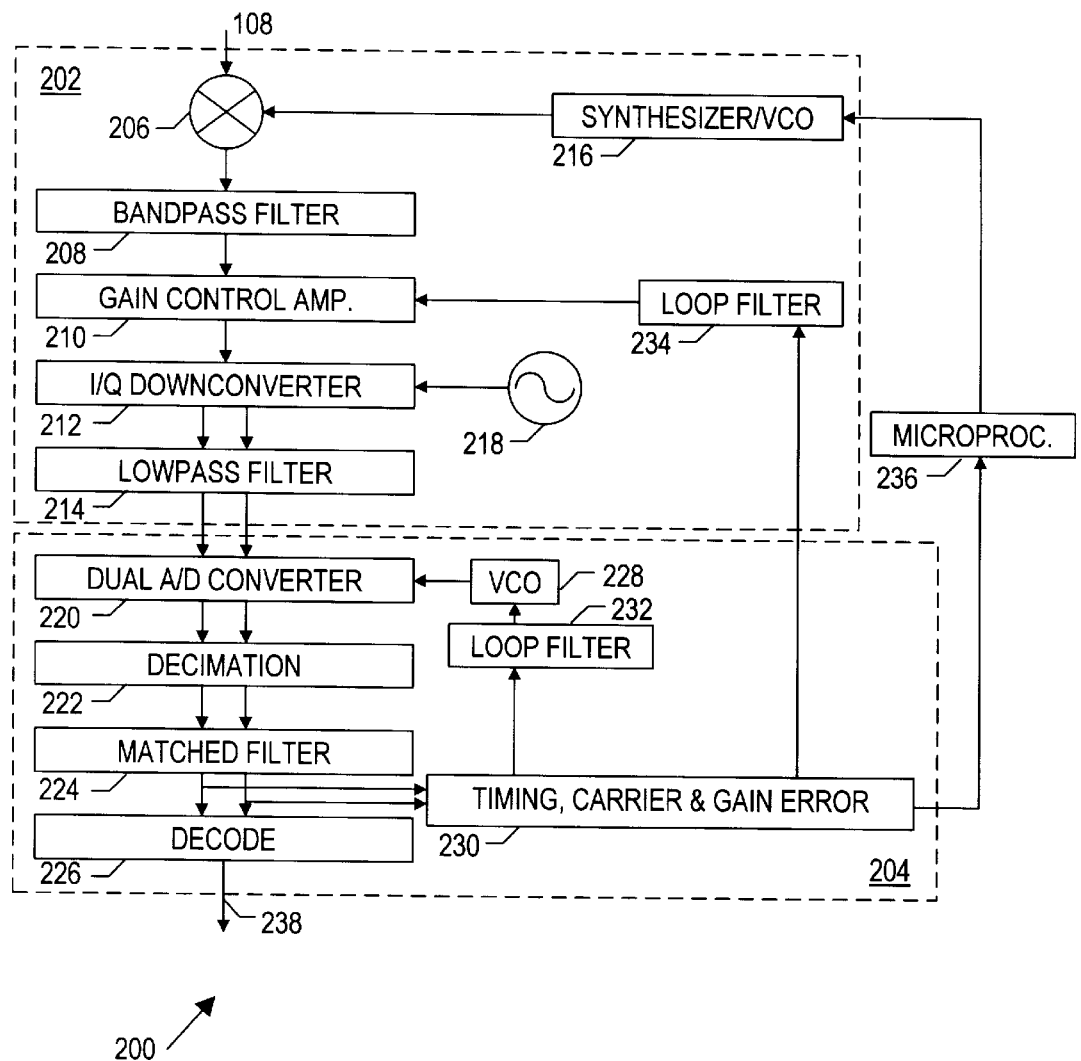
FIG. 2 is a block diagram of a DBS receiver front end embodiment which compensates for frequency offset error using an external microprocessor.
Figure 3:
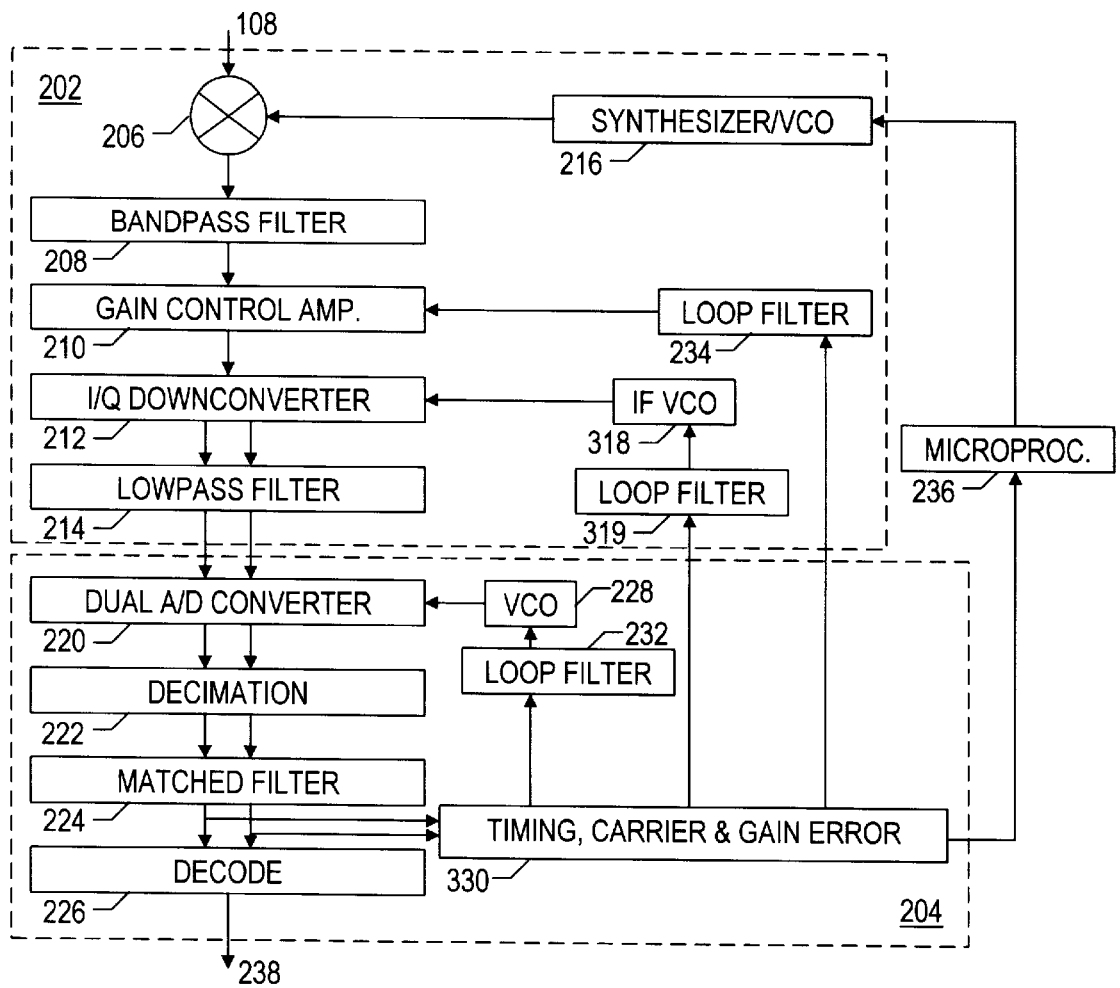
FIG. 3 is a block diagram of a DBS receiver front end embodiment which can compensate for frequency offset error by adjusting the input frequency of the I/Q downconverter.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
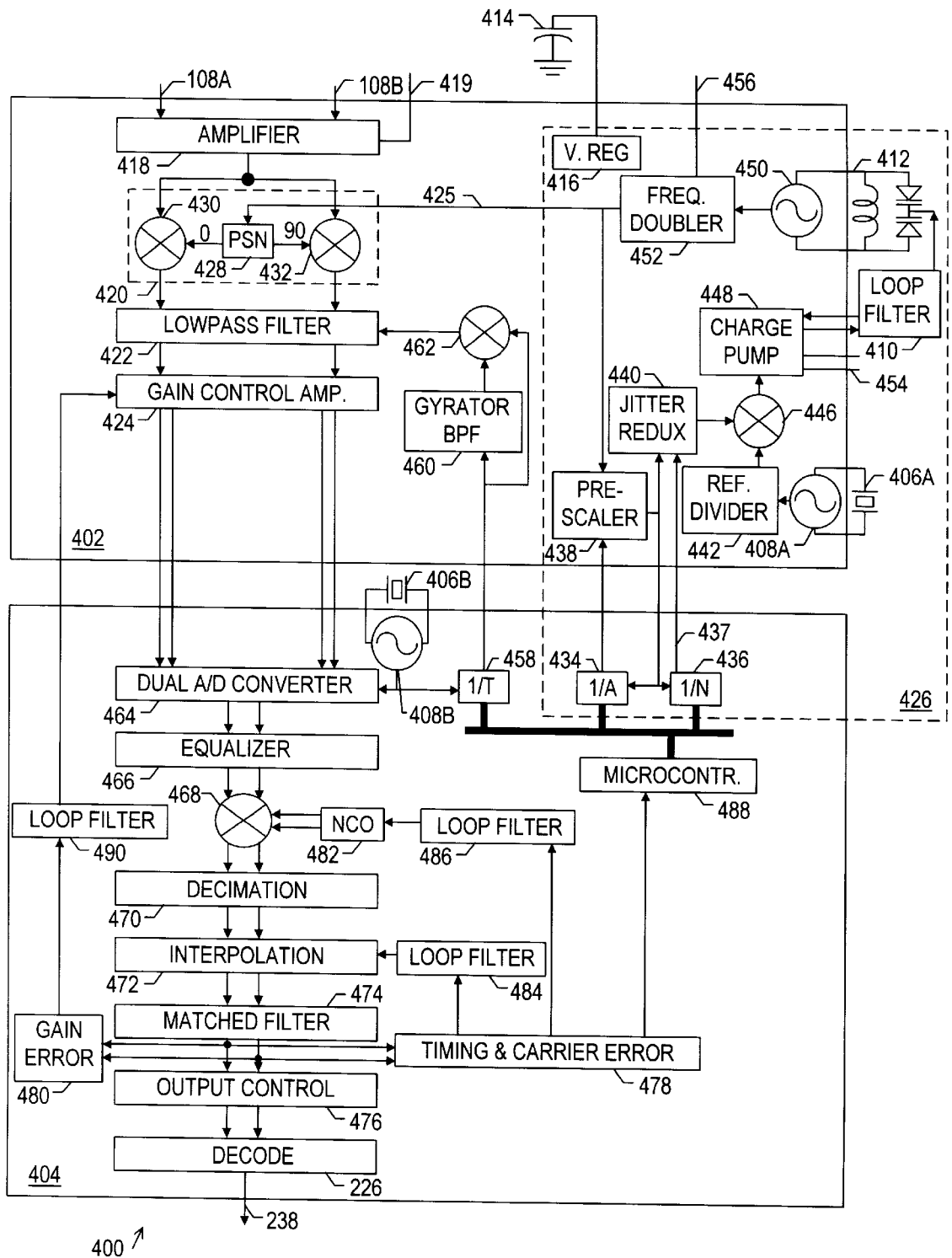
FIG. 4 is a block diagram of a DBS receiver front end embodiment according to the present invention.

In, FIG. 4 a block diagram of a DBS receiver front end 400 is shown. The DBS receiver front end 400 comprises a tuner chip 402 coupled to receive two receive signals 108A, 108B. The tuner operates on the receive signals to convert one of them to a baseband signal, which is then processed by demodulator/decoder chip 404 to remove the channel modulation and error correction coding from the signal. Generally speaking, the tuner chip includes a lowpass filter having a configurable cutoff frequency. The cutoff frequency is advantageously controlled using a clock signal with a frequency indicative of a desired cutoff frequency. As is discussed further below, the clock signal is converted into a control voltage which determines the lowpass filter cutoff frequency.

Relative to previously discussed systems, numerous configuration differences and new features exist in DBS receiver front end 400. These include (1) the front end is implemented as two integrated circuits (ICs) with a very small number of supporting discrete components, (2) the tuner is implemented using direct conversion, (3) the tuning frequency synthesizer is split into a counter sub-circuit and a phase detection and oscillator sub-circuit, (4) the phase detector has an externally configurable charge pump gain, (5) the oscillator sub-circuit employs a frequency doubler, (6) the tuner has a precision-configurable lowpass filter, (7) the interface signals between the tuner and demodulator/decoder are provided at reduced amplitude and/or slew rate, (8) the demodulator/decoder provides equalization for I/Q amplitude and phase error, (9) the demodulator/decoder directly corrects for frequency offset error. One further feature of the front end (shown in FIG. 6) is that of a maximal spacing between the pins for the received signal and pins for other high frequency signals. Each of these features is individually discussed and presented in greater detail below.

A first aspect of front end 400 is the small part count. Front end 400 comprises a tuner chip 402, a demodulator/decoder chip 404, a timing crystal(s) 406, a loop filter 410, a tank circuit 412, and a power capacitor 414. Power capacitor 414 is coupled to a voltage regulator 416 on tuner chip 402. Tuner chip 402, like most tuners, requires a very clean voltage supply for the mixer and the frequency synthesis circuitry to achieve the best phase noise performance. In the past, this has been achieved using discrete regulator components. A cost savings and a reduction of voltage supply contamination are advantageously achieved by placing the regulator on-chip. The heat is generated in regulating the amount of power required by the tuner and frequency synthesis circuitry. Heat dissipation for chips with circuits that generate heat often requires using packaging techniques that are costly and more complex than preferred techniques. However by reconfiguring the circuitry and reducing the interface signal drive power as discussed further below, the power requirements can be reduced to the point that the heat dissipation problem can be addressed with preferred packaging techniques.

A second aspect of front end 400 is the implementation of a direct-conversion tuner architecture. Tuner chip 402 includes amplifier 418, I/Q downconverter 420, lowpass filter 422, and gain control amplifier 424. Amplifier 418 buffers and amplifies either receive signal 108*a* or receive signal 108*b*. Amplifier 418 uses input select signal 419 to determine which of the receive signals 108*a*, 108*b* to forward to I/Q downconverter 420. I/Q downconverter then directly converts the forwarded signal to inphase (I) and quadrature-phase (Q) baseband signal components. The tuning signal 425 provided by frequency synthesizer 426 is set to be "tuned" to the receive signal. The tuning signal 425 is filtered by a phase-shift network (PSN) 428 to produce two versions of the tuning signal which have a 90 degree phase difference. Mixers 430, 432 combine the forwarded signal with the two versions of the tuning signal to effectively shift the modulation frequency of the forwarded signal to substantially zero in a baseband signal. The baseband signal is composed of the in-phase and quadrature phase baseband signal components provided by mixers 430, 432 respectively. The baseband signal components can be expressed as a sum of the desired signals and undesired signals. The lowpass filter 422 removes the undesired signals, leaving only the desired baseband signal components. The gain control amplifier 424 has an adaptive gain which is used to adjust the magnitude of the desired signal components to provide constant-maximum amplitude output signals (i.e. the maximum amplitude of the output signals is maintained at a substantially constant level). The output signals are forwarded in differential output form to demodulator/decoder chip 404. The direct conversion architecture and the reduced amplitude of interface signals (which is discussed further below) both contribute to the reduced power requirements of tuner chip 402.

A third aspect of front end 400 concerns frequency synthesizer 426. As shown in FIG. 4, the frequency synthesizer 426 is split into two sub-circuits which are incorporated into the tuner chip 402 and demodulator/decoder chip 404, thereby further reducing the part count. The counter sub-circuit comprises two counters, swallow counter 434 and program counter 436. After being reset, both counters count clock pulses from prescaler 438. After A clock pulses, swallow counter 434 toggles the mode of prescaler 438. The output of program counter 436 is a clock that completes one cycle for every N input pulses, so after about N/2 pulses, program counter 436 toggles its output, and after N pulses, program counter 436 toggles its output, resets itself, and resets swallow counter 434. Placing these programmable counters on demodulator/decoder advantageously isolates the majority of the digital circuitry of frequency synthesizer 426 from tuner chip 402, which is sensitive to high frequency interference such as that caused by fast-switching digital circuits.

The phase detection and oscillator sub-circuit of frequency synthesizer 426 comprises prescaler 438, jitter reduction element 440, reference divider 442, timing crystal 406, crystal oscillator 408, mixer 446, charge pump 448, loop filter 410, tank circuit 412, tuning oscillator 450, and frequency doubler 452. Tuning signal 425 is set at a tuning frequency in the following way. Prescaler 438 reduces the frequency of tuning signal 425 by a factor of (M+1) while swallow counter 434 is counting, and reduces the frequency of tuning signal 425 by a factor of M after swallow counter 434 has halted, where M is a predetermined value. The reduced frequency signal is then provided to swallow counter 434, program counter 436, and jitter reduction element 440. Swallow counter 434 is programmable to A which determines how many extra pulses should be "swallowed", i.e. how many times the factor of (M+1) should be used instead of the factor M. As explained further below, this provides a high frequency resolution in the tuning signal. Program counter 436 is programmable to N which determines how many cycles of the reduced frequency signal correspond to one cycle of its output, feedback frequency signal 437. Since the N reduced frequency signal cycles are formed from A·(M+1) tuning signal cycles and (N−A)·M tuning signal cycles, each cycle of feedback frequency signal 437 corresponds to N·M+A tuning signal cycles. This is the multiplier which is used to set the tuning frequency.

The feedback frequency signal passes through jitter reduction element 440, where the transitions are synchronized with transitions in the reduced frequency signal provided by prescaler 438. The resulting re-timed signal is mixed with a reference frequency signal provided by reference divider 442. Reference divider 442 produces this signal by dividing the frequency of the output of crystal oscillator 408 by a predetermined number. The result of the mixing operation, when passed through an active lowpass filter which is part of charge pump 448, is indicative of the phase difference between the reference frequency signal and the re-timed signal. Charge pump 448 applies a correction voltage to loop filter 410 which determines the control voltage applied to the node between the varactors in tank circuit 412. The control voltage varies the effective capacitance of the varactors, and hence the resonance frequency of tank circuit 412. The resonance frequency of tank circuit 412 determines the frequency of the output of tuning oscillator 450. Frequency doubler 452 provides a tuning frequency signal with the frequency of the output of the tuning oscillator when in disabled mode, but when in enabled mode, frequency doubler 452 provides a tuning frequency signal with double the frequency of the output of the tuning frequency oscillator 450.

The correction voltage of charge pump 448 acts to adjust the frequency of the output of tuning oscillator 450 to reduce the phase difference between the re-timed signal and the reference frequency signal. When the frequency synthesizer 426 is in steady state (i.e. the loop is "locked"), the frequency and phase differences between the re-timed signal and the reference frequency signal are substantially zero, and the tuning frequency signal 425 has a frequency of $$F_T = (N \cdot M + A) \cdot F_R,$$

where $F_R$ is the reference frequency. The desired tuning frequency is thereby determined by the setting of the counters 434, 436 on the demodulator/decoder chip. This eliminates the need for a bus connection between the system microprocessor and the noise sensitive tuner chip, since the system microprocessor specifies the desired reception band by communicating with the demodulator/decoder chip.

To aid in the acquisition of phase lock, charge pump 448 may be configured to cause a frequency sweep by providing a constant, nonzero correction voltage until a phase lock is detected. For further details on the operation of a frequency synthesizer, please refer to the Fujitsu application note "Fujitsu Prescalers and Phase-Locked Loops for VHF and UHF Frequency Synthesis: A Tutorial with Selection Guides," published in March 1991 by the Field Applications Engineering Department of Fujitsu Microelectronics, Inc., which is hereby incorporated by reference.

A fourth aspect of front end 400 concerns the charge pump. Charge pump 448 has an externally configurable gain, which can be set using digital inputs 454. These inputs are used to set the gain to one of four values. The values are chosen to provide constant phase lock loop behavior across the entire frequency synthesis range.

A fifth aspect of front end 400 concerns the use of a frequency doubler. In a direct conversion DBS front end, the tuning frequency must cover the range 925 to 2150 MHz. Designing a tuning oscillator to provide this frequency range is very difficult. To maintain the nonlinearity of the voltage-to-frequency relationship of the tuning oscillator within the stability limits of the frequency synthesizer loop, it is desirable to limit the range of the tuning oscillator to a single frequency octave. This range may then be extended through use of a doubler. Tuning oscillator 450 may be designed to operate in the octave between 537.5 and 1075 MHz. The enabling of frequency doubler 452 then alters this range to the octave between 1075 and 2150 MHz. The enable signal 456 for the frequency doubler thereby allows selection between these octaves, and extends the tuning frequency range from 537.5 to 2150 MHz. The doubler provides (a) an extended tuning range (as already explained), and (b) better isolation between tank circuit 412 and receive signals 108a, 108b, since the tank circuit operates at half the tuning frequency in the high frequency octave.

A sixth aspect of front end 400 is the configuration method of lowpass filter 422. In a direct conversion tuner, no IF (intermediate frequency) filter is present. All the filtering to remove adjacent channels and noise is performed on the baseband signals by lowpass filter 422. Consequently, the performance of these filters is crucial, and tight control of the cut-off frequency is desirable. Demodulator/decoder chip 404 includes a programmable divider 458, which divides the output of crystal oscillator 408-B to provide a clock signal with a frequency indicative of the desired cutoff frequency of lowpass filter 422. Tuner chip 402 includes a frequency-to-voltage converter, which in the embodiment shown takes the form of a gyrator bandpass filter 460 followed by a mixer 462 and a lowpass filter (not shown). Bandpass filter 460 shifts the phase of the clock signal, and the amount of phase shift is determined by the frequency of the clock signal. The phase shifted signal and the original clock signal are combined by mixer 462, and the resulting signal, when lowpass filtered, has a voltage which is determined by the phase shift, and hence the frequency of the clock signal. The voltage signal is used to adjust the cutoff frequency of lowpass filter 422. The use of a frequency signal advantageously provides a greater noise immunity and a more accurate setting of the cutoff frequency of the lowpass filter.

A seventh aspect of front end 400 concerns the interface signals between tuner chip 402 and demodulator/decoder chip 404. To reduce the digital noise interference on the tuner chip, the outputs of swallow counter 434, program counter 436, prescaler 438, and programmable divider 458 are provided at reduced voltage levels and limited slew rates. The sharp, fast transitions in digital signals cause a wide band of interference noise. Reducing the amplitude and rate of these transitions greatly reduces the intensity and frequency range of the interference noise. For example, a 100 mV peak-to-peak voltage level limitation significantly reduces the intensity of the interference noise relative to a typical 3V peak-to-peak digital signal. The slew rate is reduced by reducing the transition amplitude (by reducing the peak-to-peak voltage) and/or by increasing the transition time. The transition time may be increased to a significant fraction of the minimum cycle time of the digital signal to achieve a significant reduction in the interference noise bandwidth. The output of gain control amplifier 424 is provided to demodulator/decoder 404 in differential form to reduce the signal amplitude while maintaining a high SNR.

An eighth aspect of front end 400 concerns the correction of I/Q angular and amplitude error which may be introduced by a low cost direct conversion architecture. Demodulator/decoder chip 404 comprises an analog-to-digital converter (ADC) 464, an optional angular error equalizer 466, a complex multiplier 468, a decimation block 470, an interpolation block 472, a matched filter 474, an output control circuit 476, decode logic 226, a timing and carrier error block 478, and a gain error block 480. ADC 464 converts the baseband signal components into digital form at a sampling rate and sampling phase determined by a signal from crystal oscillator 408B. As will be discussed further below, external oscillator is set to oversample (i.e. sample at a rate more than twice the highest frequency component) the baseband signal components.

The digital baseband signal components may pass through an optional equalizer 466. Optional equalizer 466 is designed to correct I/Q angular error and I/Q amplitude imbalance. Ideally, the I and Q components represent portions of the receive signal that are 90 degrees out of phase. When the tuner and subsequent circuitry is less than ideal, the I and Q components may no longer be 90 degrees out of phase, and hence have an angular error sufficient to degrade performance. Additionally, the two separate signal paths for the I/Q components may result in an amplitude imbalance which can degrade performance. This angular error and amplitude imbalance is correctable by use of an adaptive finite-impulse response (FIR) filter which adjusts the amplitude and phase of one component relative to the other. Hence the addition of an angular error equalizer avoids the problem of degraded performance which might otherwise occur due to use of a direct downconversion tuner.

A ninth aspect of front end 400 concerns the correction of frequency offset error by demodulator/decoder chip 404. The digital baseband signals are multiplied by an output signal from a numerically controlled oscillator (NCO) 482 by complex multiplier 468. NCO 482 is set to provide a signal which cancels the frequency offset error. An important advantage is gained by canceling the offset error while the signal is oversampled. The range over which the frequency offset error can be tracked and compensated is $K \cdot F_x/2$, where K is the number of samples per symbol and $F_x$ is the symbol rate. By allowing K to range as high as 16 or more, the tracking range is greatly extended relative to Nyquist sampling (K=1). Since a tuner which performs direct downconversion to baseband (e.g. tuner chip 402) is susceptible to significant frequency offset errors in the baseband signal, having an extended tracking range in the demodulator/decoder makes using the more costeffective, direct downconversion tuners feasible. The direct correction of the frequency offset error by the demodulator/decoder also enhances system performance by eliminating the delay introduced by external microprocessor control of the frequency synthesizer.

The offset-error canceled signal at the output of complex multiplier 468 passes through decimation block 470 which lowpass filters the digital baseband signal in preparation for downsampling. Interpolator 472 then reduces the sampling rate to two samples per symbol, with the sampling times adjusted according to feedback from loop filter 484. The downsampled signal is coupled to matched filter 474, which is designed to substantially maximize the signal-to-noise ratio of the digital baseband signal. To accomplish this, the impulse response of matched filter 474 is designed to be the time-reverse of the shape of a signal corresponding to one symbol. Hence, the impulse response is "matched" to the symbol signal. One common symbol signal shape is a square root raised cosine.

Prior to the decoding stage, the sampling rate of the signal is made equal to the symbol rate. This is accomplished by output control block 476 which passes on only one sample per symbol. The resulting sample sequence is processed by decode logic 226 to provide error correction and substantially recover the transmitted data stream. This received data stream is then provided as decoded output signal 238.

The signal provided at the output of matched filter 474 is processed by gain error block 480 to determine an estimate of the amplitude error in the equalized signal. The amplitude error estimates are processed by loop filter 490, which then adjusts the gain of gain control amplifier 424. The output of matched filter 474 is also processed by timing and carrier error block 478 to determine an estimate of timing error conditions present in the equalized signal. One estimate is for the sampling phase error, and this estimate is passed to loop filter 484. Loop filter 484 operates to regulate the sampling phase of interpolator 472. Another estimate is for the frequency offset error of the tuning signal, and this is passed to loop filter 486 and onboard microcontroller 488. Two frequency offset correction modes may be used. At high symbol rates (i.e. when the desired reception bandwidth is roughly the same size as the lowpass filter bandwidth), the frequency offset is corrected by the microcontroller 488 which "bumps" the setting of frequency synthesizer 426. The setting is adjusted by changing the swallow counter value A and possibly changing the program counter value N as well. At these symbol rates, the timing loops remain locked, and performance is not compromised. At low symbol rates (i.e. when the desired reception bandwidth is significantly smaller than the lowpass filter bandwidth) or small frequency offset error values, the receive signal is allowed to drift within the lowpass filter, and the frequency offset error estimates are processed by loop filter 486 to adjust the setting of NCO 482, which then compensates the offset error.

Figure 5:
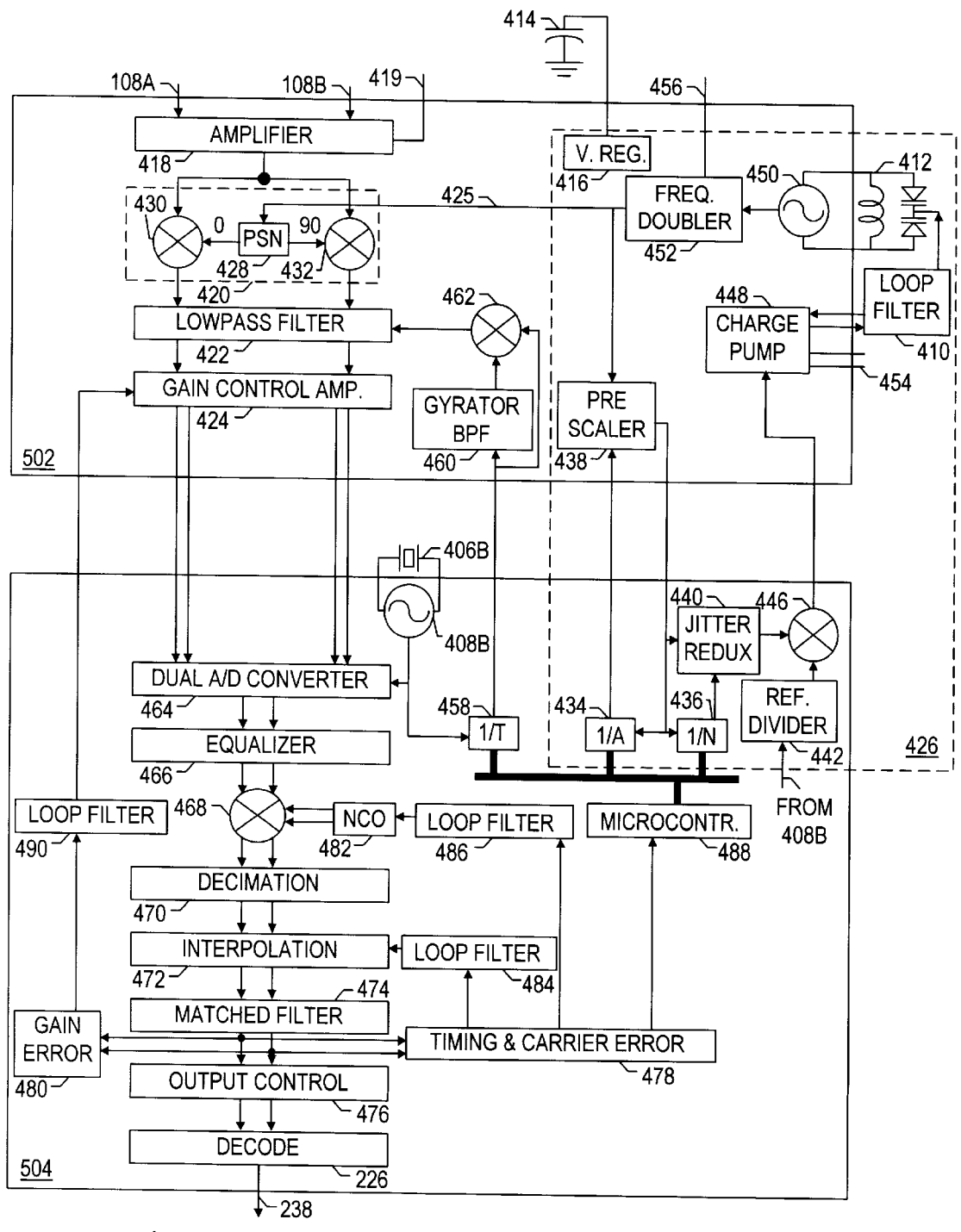
FIG. 5 is a block diagram of a second DBS receiver front end embodiment according to the present invention.

Turning now to FIG. 5, an alternative architecture for sub-dividing the frequency synthesizer 426 is shown. The phase detection portion, which comprises jitter reduction element 440, reference divider 442, and mixer 446, is placed on demodulator/decoder chip 504 with counters 434, 436. The oscillation portion, which comprises charge pump 448, loop filter 410, tank circuit 412, tuning oscillator 450, and frequency doubler 452 remains on the tuner chip 502 with prescaler 438. Excepting prescaler 438, all the digital circuitry is thereby removed from tuner chip 502, yielding a significant reduction in digital noise interference with tuner chip 502. It is expected that there is a tradeoff in frequency synthesizer performance due to interference with the output of mixer 446. However, this may be addressed by using a digital phase detector in place of mixer 446. To avoid reintroducing digital noise interference, the output of the digital phase detector would require a limited voltage range and slew rate.

Figure 6:
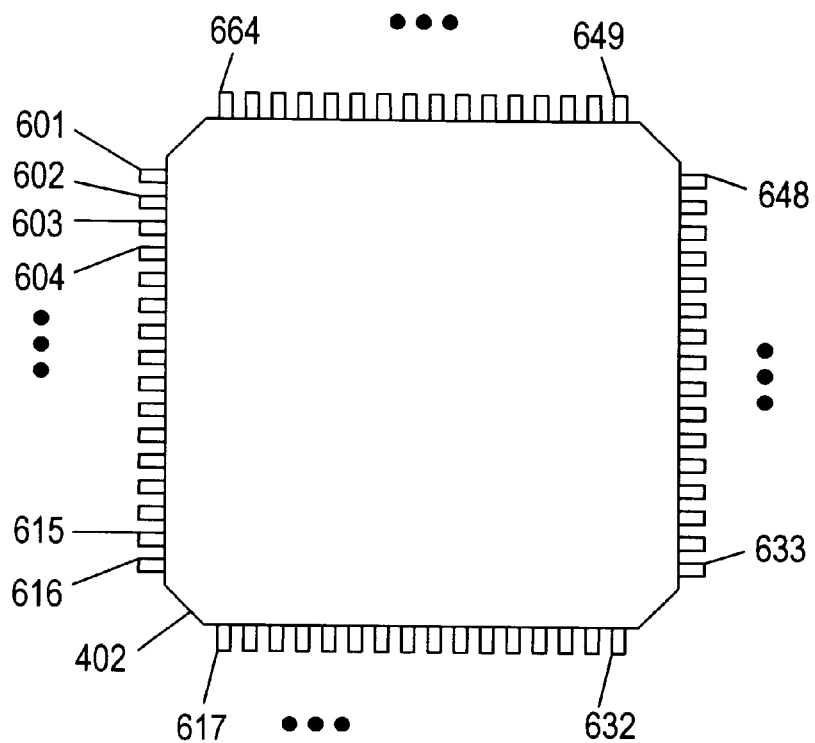
FIG. 6 is a pin diagram of a tuner chip.

Turning now to FIG. 6, an exemplary pin out of a tuner chip 402 is shown. For the purposes of discussion, it is assumed that tuner chip 402 is manufactured in a square, 64-pin, surface mount package, with pins numbered 601 through 664 as shown. However, it is noted that any packaging type may indeed be used. The pin out of tuner chip 402 is distinguished by the feature that the input pins for the received signal are maximally spaced from pins for other high frequency input or output signals. This provides for a strongly reduced high frequency coupling to the received signal input line, which advantageously eliminates the need for special purpose couplers to prevent RF leakage into the input lines. The maximal spacing is achieved primarily by designating a corner pin (e.g. pin 664) as the received signal input pin, and designating pins on the opposite side of the chip as the tank circuit pins (e.g. pins 631, 632). These pins would preferentially be near the diagonally opposite corner from the received signal input pin, as in the given example. However, when a second receive signal input pin is present, the two receive signal input pins are positioned to form two vertices of an approximately equilateral triangle, with the third vertex being the adjacent tank circuit pins (e.g. receive signal pins 664, 617, and tank circuit pins 640, 641). This provides for maximal spacing to minimize the RF coupling. This strategy may be applied to packages with rectangular pinouts, where the resulting triangle is as close to equilateral as practical.

For one reason or another, the corner pins may be already assigned and it would be impractical to assign the high frequency signal pins to be adjacent to the package corners. The following method is provided as a way to determine a "good" distributed high frequency pin assignment. Assuming that the package has N pins, that the pins are numbered in a sequential fashion along the perimeter of the package, and that pins for M high frequency signal sources need to be distributed, then the pin numbers may be determined according to the formula:

$$P_i = \text{round}(i \cdot N/M) + C \bmod N, \; i=1,\ldots,M,$$

where C is an offset number which may be chosen to shift the distribution of pins around the perimeter of the chip to better minimize any high frequency signal interference or to better fit the pins assignments with previously assigned pins. Signal sources having more than one associated pin typically have the associated pins adjacent to one another. (It is noted that the first and last pins are considered to be adjacent, e.g. pins 601, 664.) For these signal sources, only one pin number would be determined from the formula, and adjacent pin numbers are chosen for the rest of the associated pins. For two signal sources on the 64 pin package of FIG. 6, the pins are diametrically opposed. For three signal sources, pins 621, 643, 664 or some shifted version of this (e.g. 660, 617, and tank circuit pins 639, 640) provide a "good" distribution of the high frequency signal source inputs. Acceptable variations on the above formula include replacing the round(iN/M) term with an upper or lower bound term, e.g. $i \cdot \lceil N/M \rceil$ or $i \cdot \lfloor N/M \rfloor$.

Figure 7:
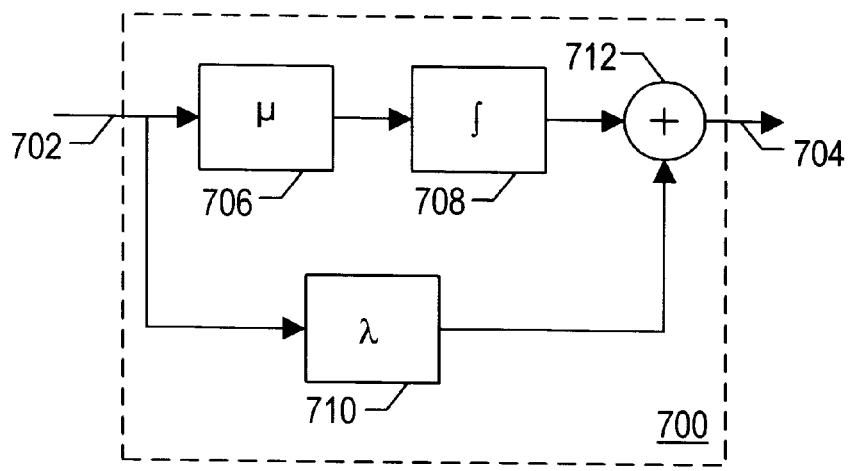
FIG. 7 is a block diagram of a loop filter which may be used to convert timing errors to an estimate of a frequency or phase error.

The regulation mechanism for gain control amplifier 424 is a loop filter 490 which operates on a negative feedback signal provided by gain error block 480. The effect of loop filter 490 is to increase the gain of gain control amplifier 424 when the maximum amplitude of the output signal declines below a target level, and to decrease the gain when the maximum amplitude exceeds a target level. Turning now to FIG. 7, a block diagram of an exemplary loop filter 700 is shown. Loop filter 700 converts an error signal 702 into a feedback signal 704. Error signal 702 is multiplied (706) by a scale factor $\mu$ and integrated (708). Error signal 702 is also multiplied by a second scale factor $\lambda$ (710) and added (712) to the result from integrator 708 to form feedback signal 704. Details on the theory of feedback control may be found in many standard textbooks.

In summary, DBS receiver embodiments have been described which (1) implement the front end as two integrated circuits with a very small number of supporting discrete components, (2) convert directly from the received signal to the baseband representation, (3) implement the tuning frequency synthesizer with digital counters on a CMOS IC and an oscillation sub-circuit on a bipolar IC, (4) provide an externally configurable charge pump on the (bipolar) tuner IC, (5) employ a frequency doubler in the oscillation sub-circuit, (6) provide a precision-configurable lowpass filter on the tuner IC, (7) use reduced amplitude and slew rate interface signals between the tuner and demodulator/ decoder, (8) correct I/Q amplitude and phase error using a digital equalizer, (9) digitally track and compensate for frequency offset error in the demodulator/ decoder, and (10) maximally space the pins for the receive signal and the local oscillator tank circuit. Each of these characteristics individually and in combination act to improve the DBS receiver front end performance and/or decrease implementation cost.

Numerous variations and modifications will become apparent to those skilled in the art once the above disclosure is fully appreciated. It is intended that the following claims be interpreted to embrace all such variations and modifications.

What is claimed is:

1. A DBS receiver front end comprising:
   a tuner chip having a lowpass filter with a configurable cutoff frequency, wherein the tuner is configured to adjust the cutoff frequency based on a clock signal frequency of a clock signal, wherein the tuner chip is further configured to receive a receive signal, to convert the receive signal to a product signal, and to filter the product signal with the lowpass filter to provide a baseband signal; and
   a demodulator/decoder chip coupled to receive the baseband signal and configured to convert the baseband signal to a decoded signal, wherein the demodulator/ decoder chip is further configured to provide said clock signal,
   wherein the tuner chip further comprises a frequency-to-voltage converter coupled to convert the clock signal frequency into a control voltage which is applied to the lowpass filter to adjust the cutoff frequency.

2. The DBS receiver front end of claim 1, wherein the frequency-to-voltage converter comprises:

a bandpass filter coupled to provide a frequency-dependent phase shift to the clock signal to produce a phase shifted signal; and a mixer coupled to combine the phase shifted signal with the clock signal to produce the control voltage.

3. A DBS receiver front end comprising:

a tuner chip having a lowpass filter with a configurable cutoff frequency, wherein the tuner is configured to adjust the cutoff frequency based on a clock signal frequency of a clock signal, wherein the tuner chip is further configured to receive a receive signal, to convert the receive signal to a product signal, and to filter the product signal with the lowpass filter to provide a baseband signal; and a demodulator/decoder chip coupled to receive the baseband signal and configured to convert the baseband signal to a decoded signal, wherein the demodulator/decoder chip is further configured to provide said clock signal, wherein the demodulator/decoder chip further comprises:
a crystal oscillator configured to provide a timing signal having a crystal resonance frequency;
a programmable divider coupled to receive the timing signal, wherein the programmable divider is configured to provide said clock signal by dividing the crystal resonance frequency by an adjustable constant.

4. The DBS receiver front end of claim 3, wherein the demodulator/decoder chip further comprises a microcontroller configured to set the adjustable constant to provide a desired reception bandwidth.

5. The DBS receiver front end of claim 4, wherein the microcontroller is further configured to set a program counter to provide a desired reception frequency.

6. The DBS receiver front end of claim 3, wherein the demodulator/decoder chip further comprises:

an analog-to-digital converter coupled to convert the baseband signal into a digital baseband signal;

a filter coupled to filter the digital baseband signal to produce a filtered signal, wherein the filter is configured to maximize a signal to noise ratio of the filtered signal;

a decoder coupled to convert the filtered signal into said decoded signal.

7. A tuner configured to receive a receive signal and convert the receive signal into a baseband signal, wherein the tuner comprises:

a lowpass filter with an adjustable cutoff frequency to control a bandwidth of the baseband signal, wherein the cutoff frequency is determined by a control voltage;

a frequency-to-voltage converter configured to receive a clock signal having a clock signal frequency, wherein the frequency to voltage converter is further configured to convert the clock signal frequency into the control voltage.

8. The tuner of claim 7, wherein the frequency-to-voltage converter comprises:

a bandpass filter coupled to provide a frequency-dependent phase shift to the clock signal to produce a phase shifted signal; and a mixer coupled to combine the phase shifted signal with the clock signal to produce the control voltage.

9. The tuner of claim 7, wherein said baseband signal comprises an in-phase signal component and quadrature-phase signal component, and wherein the tuner further comprises:

an I/Q downconverter coupled receive the receive signal and a tuning frequency signal, wherein the I/Q downconverter is configured to responsively provide a first product signal and a second product signal to the lowpass filter;

a gain control amplifier coupled to receive the baseband signal components from the lowpass filter, wherein the gain control amplifier multiplies the baseband signal components by an adjustable gain to produce constant-maximum baseband signal components.

10. The tuner of claim 9, wherein the I/Q downconverter comprises:

a phase-shift network which converts the tuning frequency signal into a zero-phase signal and a 90-degree-phase signal;

a first mixer coupled to combine the zero-phase signal with the receive signal to provide the first product signal; and a second mixer coupled to combine the 90-degree-phase signal with the receive signal to provide the second product signal.

11. A method for converting a receive signal to a baseband signal, wherein the method comprises:

setting a tuning frequency signal to indicate a desired reception frequency;

providing a clock signal frequency of a clock signal to indicate a desired reception bandwidth;

determining a lowpass filter cutoff frequency from said clock signal frequency;

receiving the receive signal;

combining the tuning frequency signal with the receive signal to produce a product signal; and lowpass filtering the product signal to attenuate signal energy above the cutoff frequency, wherein said determining comprises:
filtering the clock signal to produce a phase shifted signal;
mixing the phase shifted signal with the clock signal to produce a mixed signal; and
lowpass filtering the mixed signal to produce a cutoff frequency control voltage.

12. A method for converting a receive signal to a baseband signal, wherein the method comprises:

setting a tuning frequency signal to indicate a desired reception frequency;

providing a clock signal frequency of a clock signal to indicate a desired reception bandwidth;

determining a lowpass filter cutoff frequency from said clock signal frequency;

receiving the receive signal;

combining the tuning frequency signal with the receive signal to produce a product signal; and lowpass filtering the product signal to attenuate signal energy above the cutoff frequency, wherein said providing comprises:
receiving a crystal oscillation signal;
counting cycles in the crystal oscillation signal with a counter; and
restarting the counter when a programmable value is reached.

* * * * *